United States Patent
Fang et al.

(10) Patent No.: US 6,815,292 B1
(45) Date of Patent: Nov. 9, 2004

(54) FLASH MEMORY HAVING IMPROVED CORE FIELD ISOLATION IN SELECT GATE REGIONS

(75) Inventors: Hao Fang, Cupertino, CA (US); Mark S. Chang, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 216 days.

(21) Appl. No.: 10/260,061

(22) Filed: Sep. 27, 2002

Related U.S. Application Data

(62) Division of application No. 09/495,425, filed on Jan. 31, 2000, now abandoned.

(51) Int. Cl.[7] .............................................. H01L 29/72
(52) U.S. Cl. ....................... 438/264; 438/296; 438/257; 438/258; 438/267; 257/321
(58) Field of Search ................................ 438/284, 296, 438/251, 258, 267; 257/321

(56) References Cited

U.S. PATENT DOCUMENTS 6,013,551 A * 1/2000 Chen et al. .................. 438/264

* cited by examiner

Primary Examiner—Edward Wojciechowicz
(74) Attorney, Agent, or Firm—Winstead Sechrest & Minick P.C.

(57) ABSTRACT

A flash memory array having improved core field isolation in select gate regions via shallow trench isolation and field isolation implant after liner oxidation is disclosed. The flash memory array includes a core area and a periphery area, wherein the core area further includes a select gate region. The method of fabricating the flash memory array begins by patterning a layer of nitride over a substrate in active device locations. After the nitride is patterned, a silicon trench etch is performed to form trenches. After forming the trenches, a layer of liner oxide is grown in the trenches. Then, a field implant is performed in both the core area and periphery area to provide field isolation regions for the flash memory array with. Thereafter, poly1 is patterned in the core area to form floating gate and select word-lines.

4 Claims, 5 Drawing Sheets

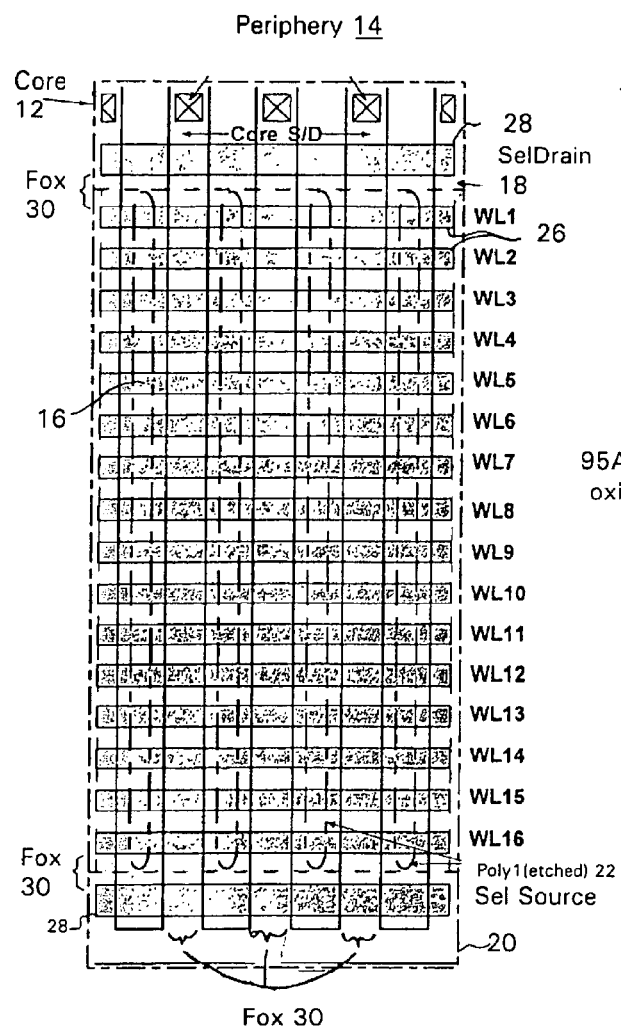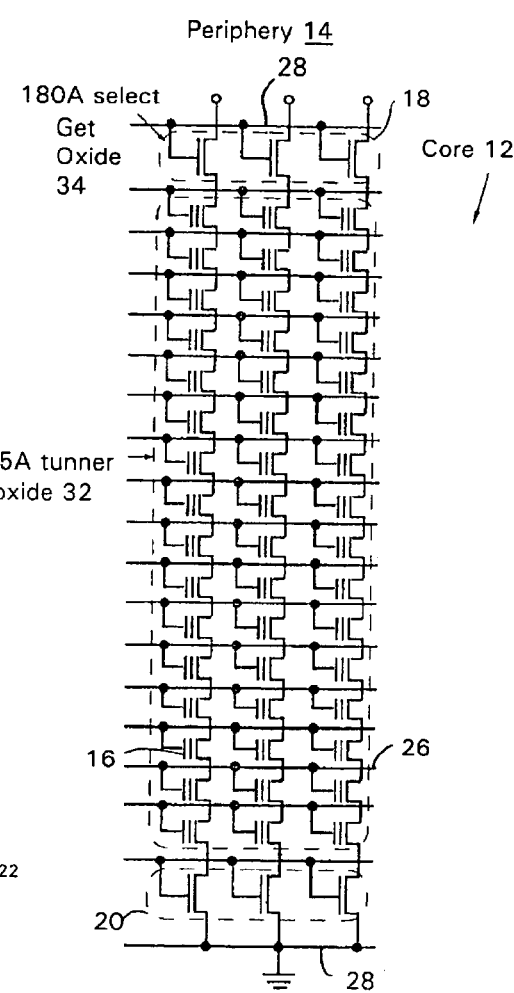
Prior Art
Fig. 1A
Prior Art
Fig. 1B

Peripheral Field Implant

Periphery Area 14

Channel Stop Implant

Core Area
12

Select Gate Regions
18 & 20

FLASH MEMORY HAVING IMPROVED CORE FIELD ISOLATION IN SELECT GATE REGIONS

CROSS-REFERENCE TO RELATED APPLICATIONS

The present application is a divisional of U.S. Ser. No. 09/495,425 filed Jan. 31, 2000, now abandoned, and assigned of record to Advanced Micro Devices, of Sunnyvale, Calif.

FIELD OF THE INVENTION

The present invention relates to flash memory arrays, and more particularly to a flash memory array having improved core field isolation in select gate regions via shallow trench isolation.

BACKGROUND OF THE INVENTION

When fabricating silicon integrated circuits, devices built onto the silicon must be isolated from one another so that these devices can be subsequently interconnected to create specific circuit configurations. From this perspective, it can be seen that isolation technology is one of the critical aspects of fabricating integrated circuits.

FIG. 1A is a top view of a portion of a NAND flash memory array 10 and FIG. 1B is a corresponding circuit diagram of the flash memory array 10. The flash memory array 10 includes a core area 12 and a periphery area 14. The core area 12 includes an array of memory transistors 16 and two select gate regions that include a row of select transistors connected by a select word-line 28. One select gate region is referred to as a select drain gate region 18 and the other select gate region is referred to as a select source gate region 20. Although not shown, the periphery area 14 contains low-voltage transistors for handling logic and switching circuitry, and high-voltage transistors for handling high-voltages encountered during flash memory programming and erase operations.

The memory transistors 16 are stacked gate structures that include a layer of type-1polysilicon (poly1) 22 that form floating gates, and a layer of type-2 polysilicon (poly2) that forms word-lines 26 interconnecting a row of memory transistors 16. The select transistors in the select gate regions 18 and 20 are single gate structures comprising a layer of poly1 22, which also forms the select word-line 28 connecting the select gate transistors. Fabricating such an array is a multi-step process. For advanced deep submicrometer and high density flash memory technology, a dial field oxidation process, or LOCOS (LOCal Oxidation of Silicon), is usually required to optimize memory transistor isolation and periphery circuit isolation, respectively.

FIG. 2 is a flow chart illustrating the conventional process steps required to fabricate a NAND flash memory array 10. The first LOCOS process begins by defining active device regions and field regions in the core area 12 in step 50. The LOCOS process further includes patterning a nitride layer over the active device regions, and then using the nitride layer as a mask, growing a thin field oxide region (FOX) 30 between the active device regions using a thermal oxidation process in step 52.

After the first LOCOS process is completed, a peripheral field mask of photo resist is deposited and etched, which leaves the FOX regions 30 exposed in step 54. Then, a second LOCOS process is performed in which a thick field oxide is grown in the periphery area 14 in step 55, followed by deposition of a field implant mask in step 56. After the masking, a peripheral field implant is performed to create a field-isolation doping layer under the FOX regions 30 in step 57.

FIG. 3A is a cross-sectional view of the periphery area 14 of the flash memory showing the periphery field mask 36 and the exposed FOX regions 30. During the peripheral field implant, a dopant comprising Boron is typically implanted at a dose of approximately $5\times10^{12}$ atoms/cm$^2$ at 150 keV.

Referring again to FIG. 2, after the periphery field implant, the next in the process is to deposit tunnel oxide and a layer of poly1 22 in the core and periphery areas 12 and 14 in step 58. This process results in the core area 12 having a layer of tunnel oxide 32 having a thickness of approximately 95 angstroms, and the select gate regions 18 and 20 and the periphery area having a layer of select gate oxide 34 having a thickness of approximately 180 angstroms, as shown in FIG. 1B.

After the poly1 deposition, a poly1 mask is deposited in step 60, followed by a poly1 etch in step 62. As shown in FIG. 1, the poly1 22 is etched away over the FOX regions 30, and terminates at the boundary between the core area 12 and the select gate regions 18 and 20. Because the poly1 22 serves as floating gates for the memory transistors 16 and select transistor gates as well as the select word-lines 28, the layer of poly1 22 must be continuous in the select gate regions 18 and 20 so the separate select devices can be connected together to perform their respective functions.

Referring again to FIG. 2, because of the differences in field oxide thickness between core area 12 and select gate regions 18 and 20, core isolation for a flash memory array 10, such as a NAND array, is typically achieved by performing an additional channel stop implant in the core area 12 after the poly1 etch in step 64.

FIG. 3B is a cross-sectional view of the core area 12 and the select gate region 18 and 20 during a conventional channel stop implant. As shown, the poly1 22 and the poly1 mask 38 do not cover the FOX regions 30 between the memory transistors 16, but do cover the FOX regions 30 in the select gate regions 18 and 20 since the poly1 22 forms the select word-line 28. During the channel stop implant, a dopant comprising Boron is typically implanted at a dose of approximately $1\times10^{13}$ atoms/cm$^2$ at 60 keV.

Referring again to FIG. 2, after the channel stop implant, the process continues with steps such as depositing ONO (not shown) and the poly2 to form the core word-lines 26 and the select word-lines 28.

The above approach has the disadvantage that during the channel stop implant, the dopant cannot penetrate the poly1 22 and mask 38 covering the select gate regions 18 and 20. This results in very weak isolation at the select gate regions 18 and 20 (e.g. the region between the first word-line and the select drain gate 18, and the region between the last word-line and the select source gate 20). Weak isolation in the select gate regions 18 and 20 can be problematic because the word-line voltage for the NAND flash memory can go as high as 20 volts or above during programming. At the high word-line voltage, the isolation regions, especially between the edge word-lines 26 and the select gate regions may, turn on due to the lack of a channel stop implant. The result is that the select word-lines 28 are no longer isolated from the adjacent word-lines.

Accordingly, a flash memory array having improved field isolation in the select gate regions and is needed. The present invention addresses such a need.

SUMMARY OF THE INVENTION

The present invention provides a flash memory array having improved core field isolation in select gate regions via shallow trench isolation. The flash memory array includes a core area and a periphery area, wherein the core area further includes a select gate region. The method of fabricating the flash memory array begins by patterning a layer of nitride over a substrate in active device locations. After the nitride is patterned, a silicon trench etch is performed to form trenches. After forming the trenches in the substrate, a layer of liner oxide is grown in the trenches. Then, a field implant is performed in both the core area and periphery area to provide field isolation regions for the flash memory array. Thereafter, poly1 is patterned in the core area to form floating gate and select word-lines.

According to the preferred embodiment, using shallow trenches results in stronger isolation in the select gate regions and requires only one implant for the both the periphery and the core areas, thereby reducing the number of processing steps required to fabricate the memory array.

BRIEF DESCRIPTION OF THE DRAWINGS

FIG. 1A is a top view of a portion of a flash memory array.

FIG. 1B is a corresponding circuit diagram of the flash memory array.

DETAILED DESCRIPTION OF THE INVENTION

The present invention relates to an improvement in the fabrication of memory arrays. The following description is presented to enable one of ordinary skill in the art to make and use the invention and is provided in the context of a patent application and its requirements. Various modifications to the preferred embodiment will be readily apparent to those skilled in the art and the generic principles herein may be grown to other embodiments. Thus, the present invention is not intended to be limited to the embodiment shown but is to be accorded the widest scope consistent with the principles and features described herein.

A preferred embodiment of the present invention provides a NAND flash memory array that has improved core field isolation in select gate regions and a method for fabricating the same. During fabrication, shallow trench isolation in association with a preferred implant scheme, rather than LOCOS, is used to provide field isolation structures.

Figure 2:
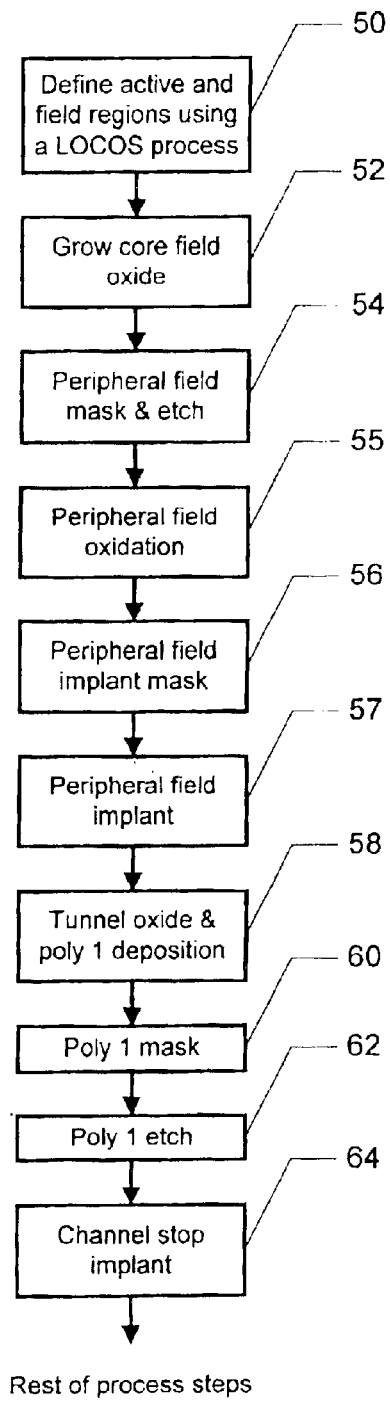
FIG. 2 is a flow chart illustrating the conventional process steps required to fabricate a NAND flash memory array.
Figure 3A:
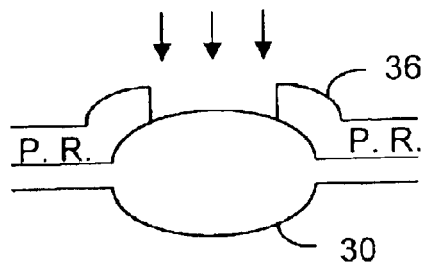
FIG. 3A is a cross-sectional view of the periphery area of the flash memory array showing the periphery field mask and the exposed FOX regions.
Figure 3B:
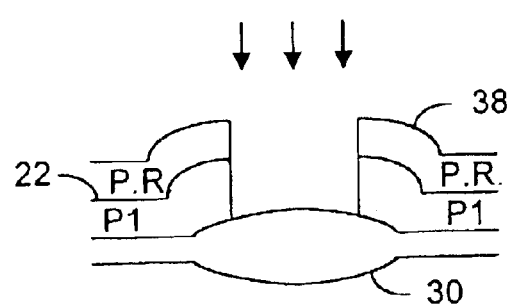
FIG. 3B is a cross-sectional view of the core area and the select gate region during a conventional channel stop implant.
Figure 3B:
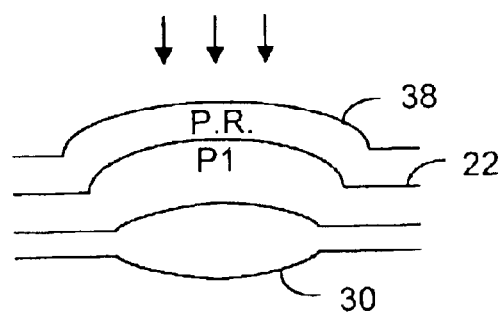
Figure 4:
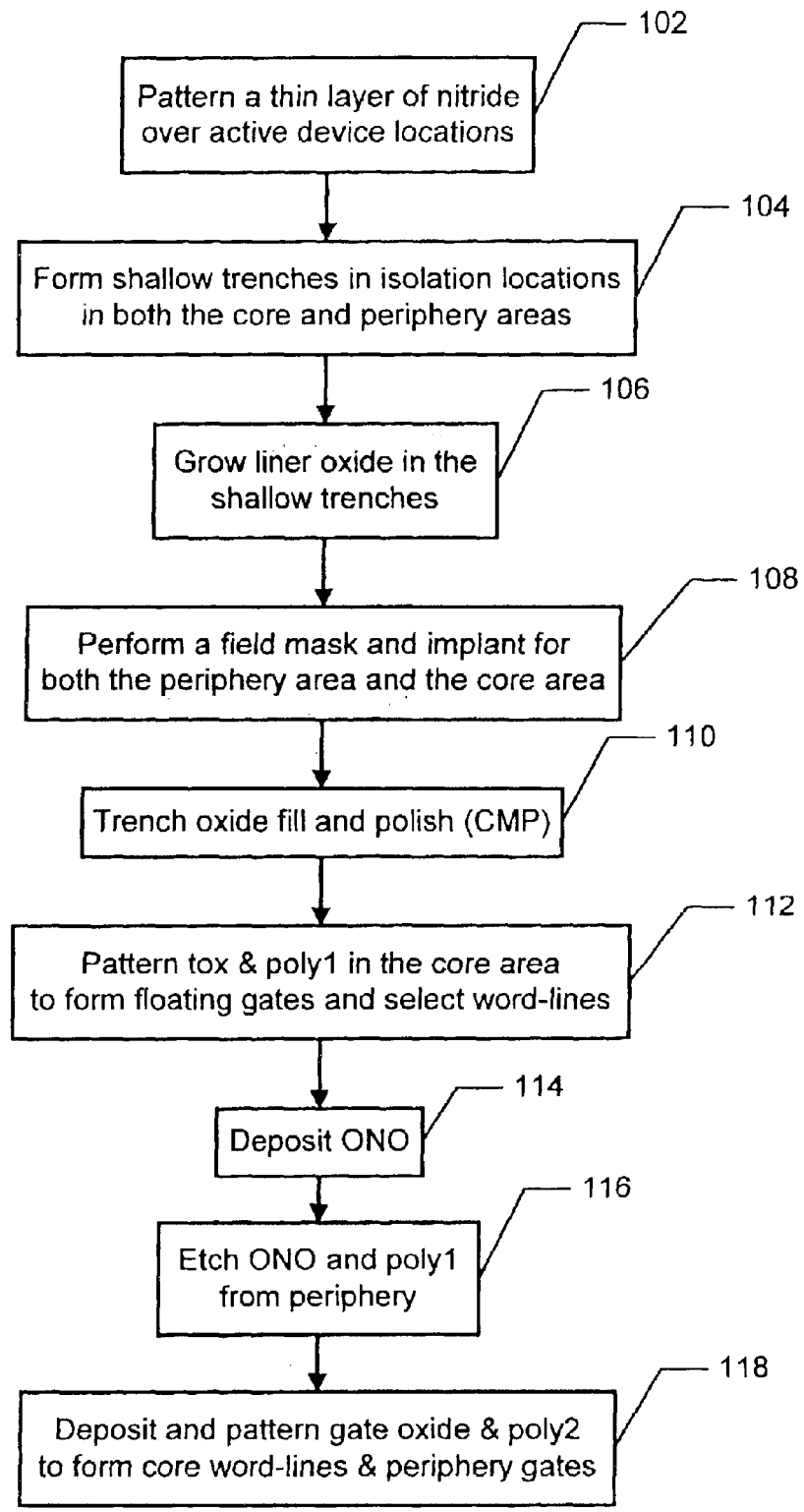
FIG. 4 is a flow chart illustrating the processing steps for fabricating a NAND flash memory array having improved core field isolation according to a preferred embodiment.

FIG. 4 is a flow chart illustrating the processing steps for fabricating a NAND flash memory array having improved core field isolation according to a preferred embodiment. The process begins by patterning a thin layer of nitride over active device locations on a substrate in step 102. According to the preferred embodiment, a silicon trench etch is performed to form shallow trenches in the substrate in isolation locations in both the periphery and core areas 12 in step 104. Preferably, the shallow trenches are anisotropically etched into the substrate and are approximately 0.3 to 0.5 $\mu$m in depth. After the shallow trenches are formed, a layer of liner oxide 42 is grown in the shallow trenches in step 106.

Figure 5A:
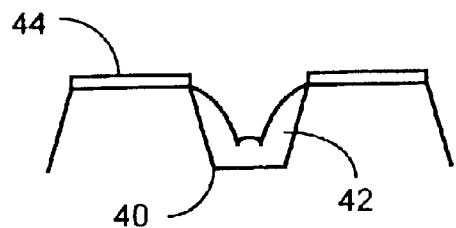
FIGS. 5A and 5B are cross-sectional views of the substrate showing example trench isolation structures.
Figure 5B:
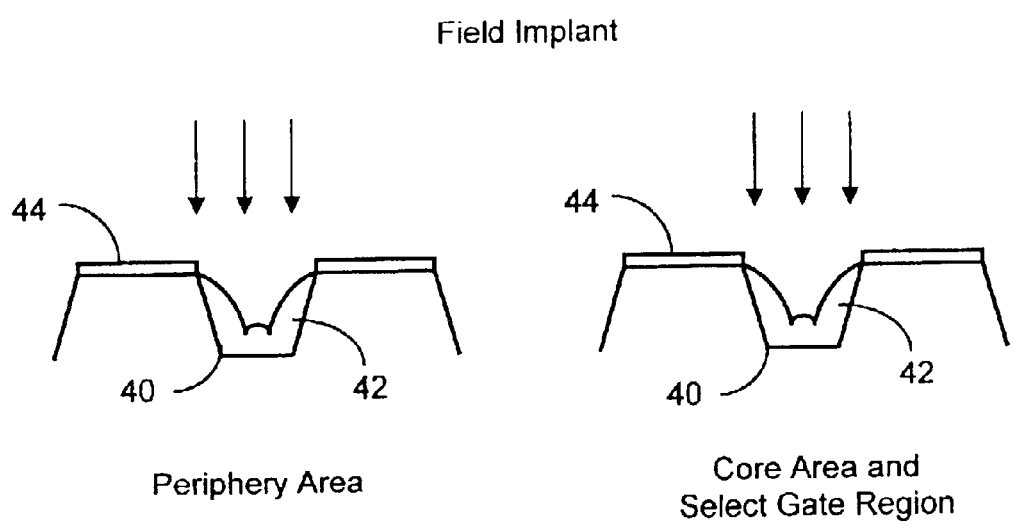

FIGS. 5A and 5B are cross-sectional views of the substrate showing example trench isolation structures. In FIG. 5, a shallow trench 40 containing liner oxide 42 is shown located between active areas, which are masked with nitride 44.

Referring to both FIGS. 4 and 5B, after the liner oxide 42 is grown, a field mask and implant are performed in both the periphery area 14 and the core area 12, which includes the select gate regions 18 and 20 in step 108, where like components from FIG. 1 have like reference numerals. According to the preferred embodiment, the field implant effectively provides field isolation regions under the shallow trenches 40, and only one implant is necessary for both the core and periphery areas 12 and 14 because poly1 22 is not relied upon as an implant mask. In a preferred embodiment, the implant comprises Boron at a dose of approximately $3 \times 10^{12}$ atoms/cm at 30 keV. In addition, due to the steep slope of the shallow trenches 40, either a zero angle or titled angle field implant may be performed to further improve the effectiveness of the field isolation doping.

After the implant is performed, trench oxide is deposited and polished back (CMP) so that the trench oxide remains only in the shallow trenches 40, its top surface level with the substrate in step 110. Referring to both FIGS. 4 and 1, after the trench oxidation, a layer of tunnel oxide and a layer of poly1 22 are patterned using deposition, masking, and etching steps to form the floating gates and the select word-lines 28 in step 112. After the poly1 22 is patterned, an interpoly dielectric layer, such as oxide nitride (ONO) (not shown), is deposited in step 114. The ONO and the poly1 are then etched from the periphery area 14 in step 116. After that, a gate oxide and poly2 are deposited and patterned to form the word-lines 26 in the core area 12 and gates for high and low-voltage transistors in the periphery area 14 in step 118.

The method for fabricating the flash memory array as described herein results in both the core area 12 and the select gate regions 18 and 20 having improved isolation due to the fact that the field implant is performed after creation of the shallow trenches 40 and liner oxidation, and before the poly1 deposition.

A flash memory array having improved core field isolation in select gate regions via shallow trench isolation has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a memory array having improved core field isolation, the memory array including a core area and a periphery area, wherein the core area further includes a select gate region, the method comprising the steps of:
   (a) pattering a layer of nitride over a substrate in active device locations;
   (b) performing a silicon etch to form trenches in the substrate;
   (c) growing a layer of liner oxide in the trenches;
   (d) performing a field implant in both the core area and periphery area to provide the memory array with field isolation regions; and (e) patterning a poly layer in the core area to form floating gate and select word-lines.

2. The method of claim 1 wherein step (b) further includes the step of:

(i) forming the trenches by etching the substrate to a depth of approximately 0.3 to 0.5 µm.

3. The method of claim 2 wherein step (d) further includes the step of:

(i) implanting Boron at a dose of $3 \times 10^{12}$ atoms/cm$^2$ at 30 keV.

4. The method of claim 3 wherein step (d) further includes the step of:

(ii) depositing a layer of trench oxide in the trenches.

* * * * *